(12) United States Patent
Charrier et al.

(10) Patent No.: US 6,444,488 B2
(45) Date of Patent: Sep. 3, 2002

(54) PROCESS OF FABRICATING ELECTRONIC MICROCOMPONENT OF THE VARIABLE CAPACITOR OR MICROSWITCH TYPE

(75) Inventors: Catherine Charrier, Saint Martin d'Heres; Eric Bouchon, Saint Egreve; Alain Campo, Sillans; Guy Imbert, Grenoble; François Valentin, Veurey Voiroize; Laurent Basteres, Grenoble, all of (FR)

(73) Assignee: Memscap and Planheas-Silmag PHS (FR)

( * ) Notice: Subject to any disclaimer, the term of this patent is extended or adjusted under 35 U.S.C. 154(b) by 0 days.

(21) Appl. No.: 09/858,092

(22) Filed: May 15, 2001

(30) Foreign Application Priority Data

May 15, 2000 (FR) .............................. 00 06142

(51) Int. Cl.$^7$ .............................................. H01L 21/00
(52) U.S. Cl. ............................. 438/48; 438/53; 438/381
(58) Field of Search .................... 438/48–53, 238–241, 438/381

(56) References Cited

U.S. PATENT DOCUMENTS 5,907,765 A * 5/1999 Lescouzeres et al. ......... 438/49
5,962,909 A   10/1999 Jerominek

FOREIGN PATENT DOCUMENTS

EP   0 909 024 A2   4/1999
EP   0 932 171 A2   7/1999

OTHER PUBLICATIONS

Darrin J. Young, Bernhard E. Boser, "A Micromachine–Based RF Low–Noise Voltage–Controlled Oscillator", IEEE 1997 Custom Integrated Circuits Conference, May 1997, pp. 431–434.

* cited by examiner

Primary Examiner—Jey Tsai
(74) Attorney, Agent, or Firm—Wall Marjama & Bilinski LLP

(57) ABSTRACT

Process for fabricating electronic components, of the variable capacitor or microswitch type, comprising a fixed plate (1) and a deformable membrane (20) which are located opposite each other, which comprises the following steps, consisting in:

depositing a first metal layer on an oxide layer (2), said first metal layer being intended to form the fixed plate;

depositing a metal ribbon (10, 11) on at least part of the periphery and on each side of the fixed plate (1), said ribbon being intended to serve as a spacer between the fixed plate (1) and the deformable membrane (20);

depositing a sacrificial resin layer (15) over at least the area of said fixed plate (1);

generating, by lithography, a plurality of wells in the surface of said sacrificial resin layer;

depositing, by electrolysis, inside the wells formed in the sacrificial resin (15), at least one metal region intended to form the deformable membrane (20), this metal region extending between sections of the metal ribbon (10, 11) which are located on each side of said fixed plate (1);

removing the sacrificial resin layer (15).

16 Claims, 5 Drawing Sheets

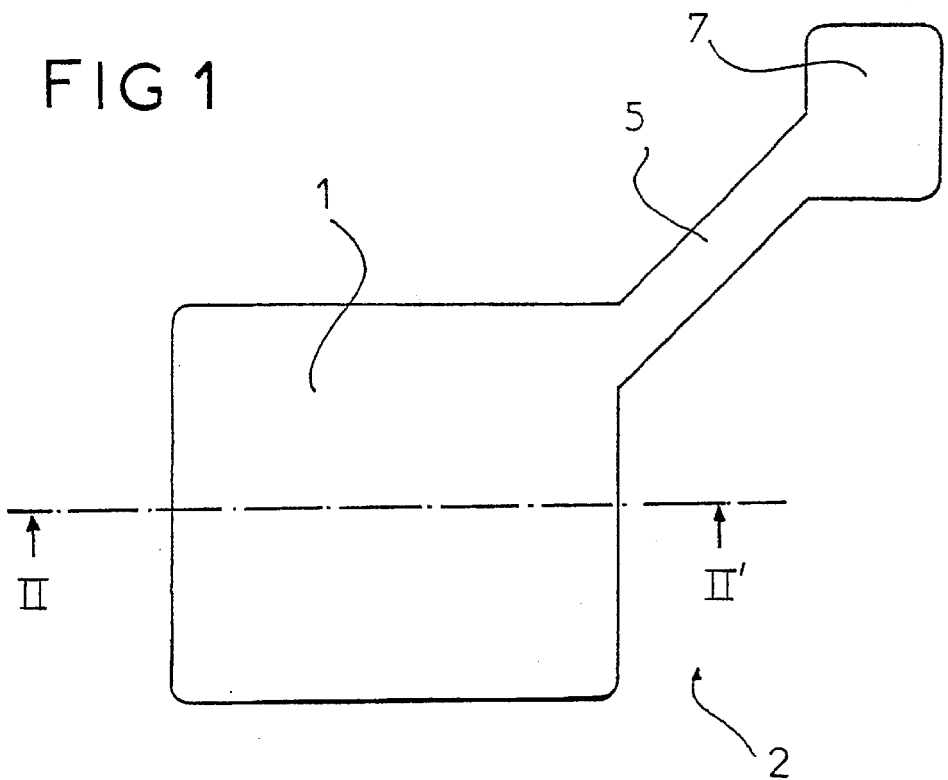
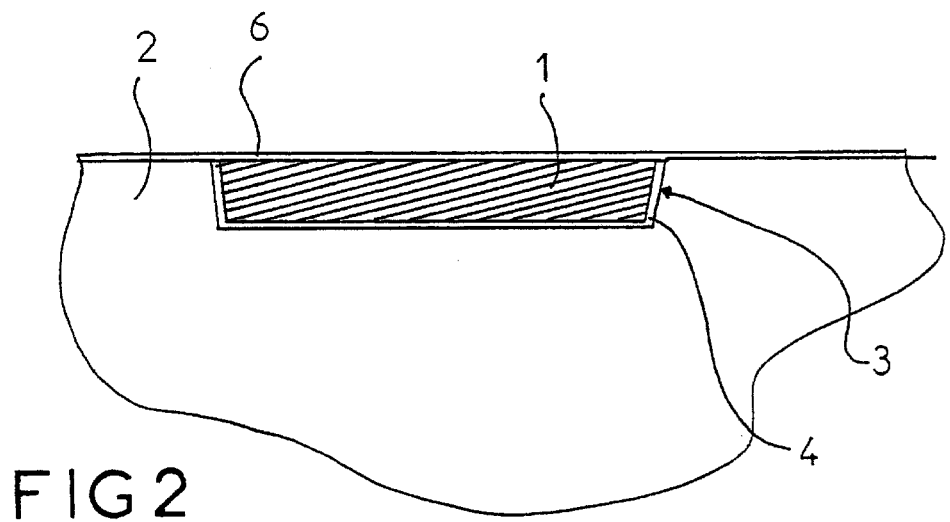

US 6,444,488 B2

PROCESS OF FABRICATING ELECTRONIC MICROCOMPONENT OF THE VARIABLE CAPACITOR OR MICROSWITCH TYPE

TECHNICAL FIELD

The invention relates to the field of microelectronics, and especially to the field of microsystem components. It relates more particularly to microcomponents of the variable microcapacitor or microswitch type which integrate a membrane that can deform under the action of electrostatic forces. It also relates to a particular process allowing such microcomponents to be obtained, which proves to be greatly advantageous over the existing processes.

PRIOR ART

It is known that the microcomponents of the microcapacitor or microswitch type have a fixed plate and a movable membrane which are separated by a volume whose dimensions can vary, especially for example when a continuous potential difference exists between the fixed plate and the deformable membrane.

By subjecting the fixed plate and the movable membrane to a particular potential difference, it is thus possible to vary the nominal value of the capacitance according to the desired application.

In certain situations, it is also possible to ensure that the movable membrane moves sufficiently close to the fixed plate to make contact. The component is then used as a microswitch.

Microcomponents of this type are generally obtained by using techniques associated with surface micromachining. Conventionally, such a membrane is obtained by processes carried out at high temperature, above 400° C., and more generally above the temperatures that can be withstood by a finished semiconductor without any risk of its functionalities being too greatly modified.

A component typically consists of a stack of thin layers, with the following conventional structure. A first layer constitutes the fixed plate of the capacitor. This layer may be made of polysilicon of the first level when the technologies used are compatible with semiconductor processing methods. This polysilicon layer is deposited on an oxide or nitride layer. In the document Darrin J. Young and Bernhard E. Boser "A Micromachine-Based RF Low-Noi se Voltage-Controlled Oscillator", IEEE 1997 Custom Integrated Circuits Conference, May 1997, pp. 431–434, microcomponents were also described in which the fixed plate is made of aluminum.

The layer that has to provide the future volume between the fixed plate and the movable plate is made of a sacrificial material deposited on top of the layer forming the fixed plate by any process compatible with the type of microcomponent that it is desired to produce. Thus, this material may conventionally be silicon dioxide ($SiO_2$) or a derivative compound which will be removed by acid etching.

The upper layer, forming the deformable plate of the microcomponent is conventionally made of polysilicon obtained by LPCVD (low-pressure chemical vapor deposition) and is doped sufficiently to reduce its resistivity. Certain techniques propose a conductive coating placed on top of the polysilicon in order to decrease the apparent resistivity thereof. This movable plate is anchored to the substrate through vias, that is to say holes etched in the oxide and/or the sacrificial film. This movable and deformable plate may also be slightly textured by features etched partially in the oxide or sacrificial film before the latter is deposited. This texturing gives the lower face of the movable plate a certain relief and limits the area of contact between the fixed plate and the movable plate in the case in which they touch. Thus, any bonding phenomena are avoided.

In order to dissolve the sacrificial layer by chemical etching, or any process allowing isotropic etching, it is essential for the layer constituting the movable plate to also be pierced over its entire area in the form of regular and repeated patterns allowing the dissolving solution to pass.

A major drawback of this type of process is that the deposition of the polysilicon layer requires the use of a high-temperature technique which is not compatible with deposition on semiconductor layers whose functionalities run the risk of being significantly modified or degraded by heat. It is therefore impossible with this kind of technique to produce microcomponents directly on existing integrated circuits by a "post-processing" technique.

The invention therefore aims to overcome these various drawbacks.

SUMMARY OF THE INVENTION

The invention therefore relates to a process for fabricating electronic microcomponents of the variable capacitor or microswitch type, comprising a fixed plate and a deformable membrane which are located opposite each other.

This process comprises the following steps, consisting in:
 depositing a first metal layer of complex shape on an oxide layer, said first metal layer being intended to form the fixed plate;
 depositing a metal ribbon, forming a border, on at least part of the periphery and on each side of the fixed plate, said ribbon being intended to serve as a spacer between the fixed plate and the deformable membrane;
 depositing a sacrificial resin layer over at least the area of said fixed plate;
 generating, by lithography, a plurality of wells in the surface of said sacrificial resin layer;
 depositing, by electrolysis, inside the wells formed in the sacrificial resin, at least one metal region intended to form the deformable membrane, this metal region extending between sections of the metal ribbon which are located on each side of said fixed plate;
 removing the sacrificial resin layer.

In other words, the process according to the invention allows production of deformable membranes produced by electrolysis, which process is carried out at room temperature. This therefore allows the microcomponent to be placed on various substrates, including integrated circuits.

Thus, in a first family of applications, the process according to the invention may be implemented using, as oxide layer, a quartz layer in order to form components incorporating only microcapacitors or microswitches.

In another type of application, the process may be implemented using, as oxide layer, an oxide layer deposited on an integrated circuit so that the microcapacitors or microswitches may be placed directly on top of the integrated circuit and can interact with functional regions of the integrated circuit, thereby limiting as far as possible the influence of the connection system since these microcomponents are closer to the integrated circuit. High integrated density is also achieved.

In practice, the first metal layer intended to form the fixed plate of the microcomponent is advantageously inserted into a recess formed in the oxide layer. In other words, the fixed metal plates may be obtained by a "damascene" metallization process. This allows particularly reliable components to be obtained, since they are strong and vibration-resistant. Furthermore, by virtue of the excellent flatness of the layers obtained by this process, it is possible to superpose several layers without building up topological irregularities. The subsequent operations are thus facilitated.

In practice, the first metal layer forming the fixed plate advantageously includes an extension associated with a connection pad mounted on or inside the oxide layer. This connection pad allows the microcomponent to be linked either to the subjacent integrated circuit or to other parts of an electronic circuit.

According to another characteristic of the invention, the spacer ribbon is present along the periphery of the fixed plate, on two opposed sides of the latter. The segments of this ribbon then serve to support the ends of the deformable membranes.

In practice, the spacer ribbon may consist of a continuous band, or even advantageously of a succession of individual segments, present only in the regions receiving the ends of the deformable membranes.

In practice, the sacrificial resin layer is advantageously deposited in such a way that it partly covers the peripheral spacer ribbon. In this way, when the deformable membrane is deposited on top of the sacrificial resin layer, the region where it joins the spacer ribbon has breaks in slope, facilitating flexure of the deformable membrane.

In practice, the process according to the invention advantageously also includes a step consisting in etching the oxide layer in order to form one or more anchoring grooves intended to accommodate part of the peripheral ribbon, or else part of the ends of the deformable membrane. This anchoring groove is located directly outside the peripheral ribbon, or else partly beneath the peripheral ribbon. This groove accommodates part of the peripheral ribbon or else part of the membrane in order to ensure that it is deeply anchored in the substrate, thereby increasing the robustness of the microcomponent.

In practice, it has been determined that the anchoring is satisfactory when the groove advantageously has a width about twice the thickness of the deformable membrane and that, complementarily, the depth of the groove is more than one and a half times its width.

According to another characteristic of the invention, the process may furthermore include a step consisting, after the fixed plate has been deposited, in depositing a film of dielectric, intended to prevent the deformable membrane from bonding to the fixed plate. Thus, direct contact between the fixed plate and the deformable plate, which could cause these two plates to bond together, and therefore damage the microcomponent, is avoided. The value of the capacitance per unit area may, furthermore, be improved if the dielectric constant of the additional film is greater than that of air.

According to another characteristic of the invention, it is possible to complete the process according to the invention by adding an additional step consisting, after the sacrificial resin has been removed, in producing, on the upper face of the deformable membrane or membranes, raised regions capable of modifying the moment of inertia of the surface of the deformable membrane so as to produce membranes with programmed deformation. This is because, as already mentioned, the modification in the capacitance of the microcomponent may arise from modification in the spacing of the deformable membrane with respect to the fixed membrane when the latter are subjected to a DC voltage component. It is therefore possible, by virtue of this arrangement, to adapt the deformation of the deformable membrane, and therefore the variation in the capacitance, to a variation in the DC component to which the microcomponent is subjected.

In practice, the raised features produced on the membranes may advantageously be longitudinal ribs.

In practice, the metals used to produce the various plates may advantageously be chosen from the group comprising, especially, copper, chromium, nickel and alloys including these metals. Different metals may be used to produce the plates and the spacer ribbon. The choice of the various materials and of the various electrolysis conditions makes it possible to accurately establish the internal stresses in the deformable membrane.

By virtue of this characteristic, it is possible to give the deformable membrane a cross section which varies over its length.

BRIEF DESCRIPTION OF THE FIGURES

The manner in which the invention is realized and the advantages which stem therefrom will become clearly apparent from the description of the method of implementation which follows, supported by the appended figures in which:

FIG. 1 is a top view of a microcomponent produced according to the process of the invention, illustrated after the fixed plate has been deposited;

FIG. 2 is a sectional view of FIG. 1 in the direction of the arrows II–II';

MANNER OF REALIZING THE INVENTION

Figure 3:
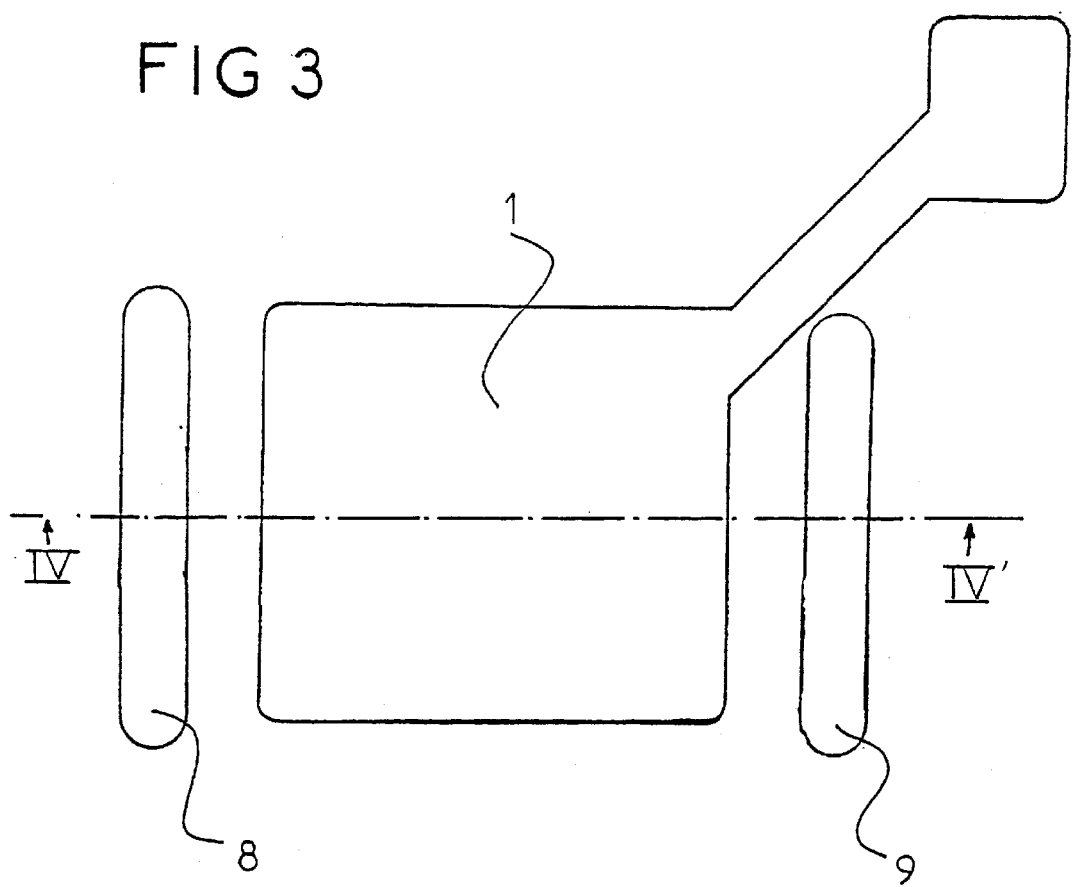
FIG. 3 is a top view of the microcomponent according to the invention illustrated after the anchoring grooves have been etched.

As already stated, the invention relates to a process allowing microcomponents, such as micro-capacitors or microswitches, to be produced. By using electrolysis steps not requiring high temperatures, it is possible to implement this process of producing the microcomponents either directly on quartz layers or directly on pre-existing integrated circuits.

Since the implementation of the process may be carried out on both these types of support, the internal structure of the substrate on which the microcomponent according to the invention is produced will not be described below.

Thus, as shown in FIG. 1, the first series of steps in the process consists in producing a fixed plate (1) on a substrate (2). The substrate (2) may either be a quartz layer, if a microcomponent is produced independently of an integrated circuit, or else the oxide layer obtained, for example, by PECVD (plasma-enhanced chemical vapor deposition), typically with a thickness of a few microns, which covers an integrated circuit.

To produce the fixed plate (1), the process starts with the production of a well (3) by etching into the oxide layer (2). Next, a metal growth sublayer (4), typically made of a copper/titanium alloy, is deposited on the oxide layer (2) and the well (3).

The well produced has a shape encompassing both that of the fixed plate (1) and that of an extension (5) forming the voltage lead to the fixed plate (1). This voltage lead (5) may be extended by a pad (7) allowing it to be connected to the microcomponent.

Next, copper is deposited electrolytically on top of the growth sublayer (4). The metal used for the electrolysis is preferably copper, chosen for its low resistivity. The electrolysis is continued until the copper layer (1) has a thickness sufficient to fill the well (3) made in the oxide layer (2).

Next, as illustrated in FIGS. 1 and 2, the copper layer (1) is planarized, allowing it to be given a surface finish with a very high flatness.

Next, a dielectric layer (6) is deposited, typically PECVD silicon oxide or nitride. This oxide film (6) has the minimum thickness for preventing the phenomena. of the deformable membrane bonding to the fixed plate (1). Interposing this oxide film (6) slightly increases the capacitance of the capacitor which will be formed with the movable plate, if the dielectric constant of this film is greater than that of air.

Figure 4:
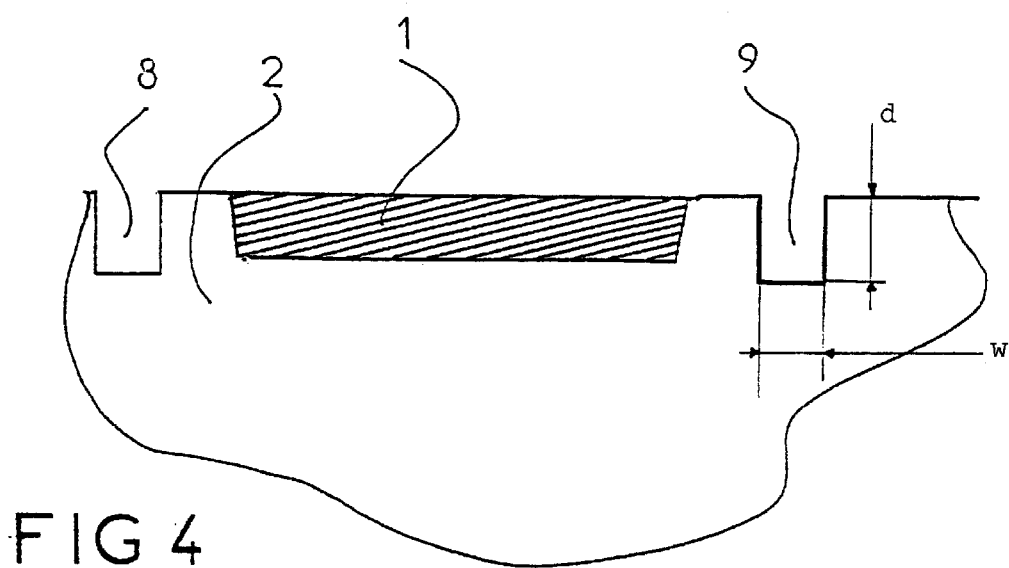
FIG. 4 is a sectional view of FIG. 3 in the direction of the arrows III–III'.

Next, as illustrated in FIGS. 3 and 4, the substrate layer (2) is etched by a conventional lithographic etching process making it possible to create a peripheral anchoring groove (8, 9). In general, this groove has a width (w) about twice the thickness of the future upper deformable membrane. The depth (d) of this groove (8, 9) is at least one and a half times its width (w).

Next, a new growth sublayer (14) is deposited on the surface of the entire region of the microcomponent. By lithographic etching, this growth sublayer is covered except in the regions for producing the peripheral borders, so as to create growth regions for the electrolysis of the peripheral ribbon (see FIG. 5). This ribbon (10, 11) is then formed by electrolysis. This ribbon (10, 11) may be made of a material identical to or different from that serving for the fixed plate (1) and for the movable plate, depending on the result desired. In the embodiment illustrated, the ribbon (10) is located between the groove (8) and the boundary (13) of the fixed plate (1), but in certain situations it is conceivable for this peripheral ribbon(10, 11) to be partly embedded within the anchoring groove (8).

Figure 5:
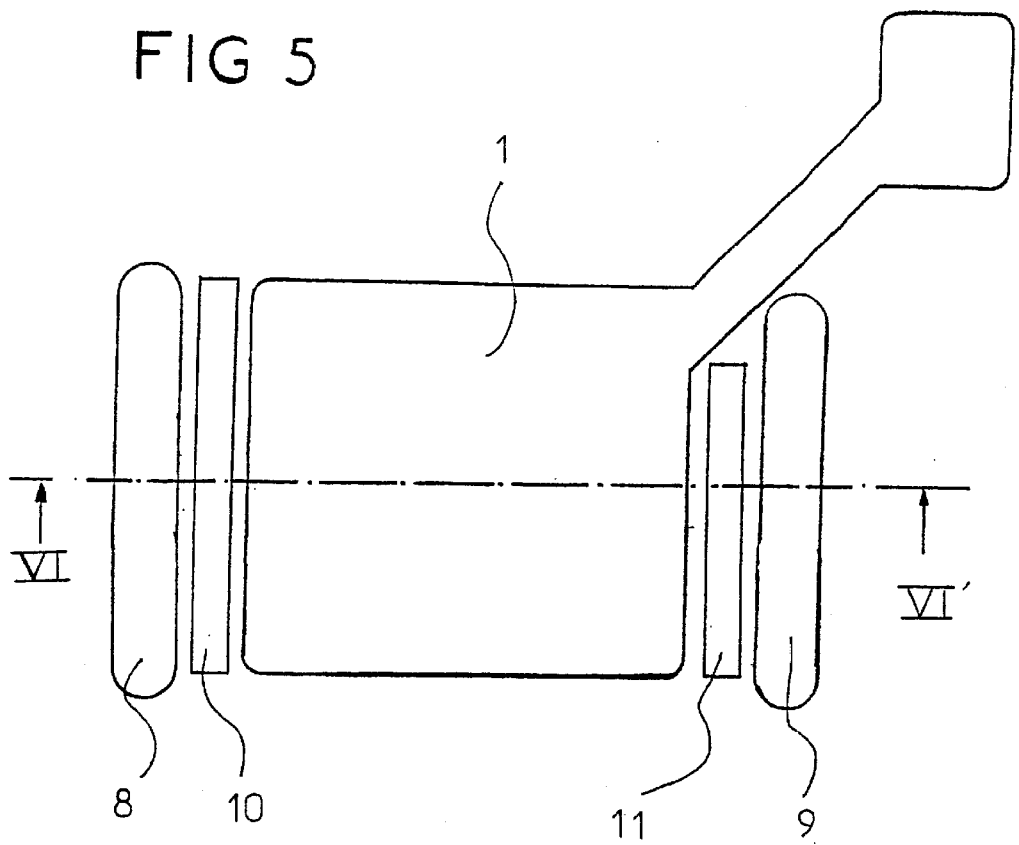
FIG. 5 is a top view of the microcomponent produced according to the invention after the spacer ribbons have been deposited.
Figure 6:
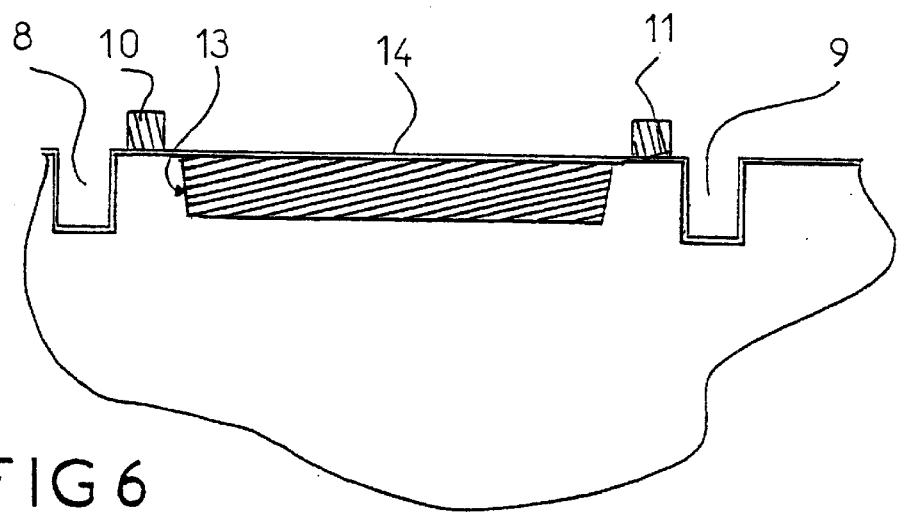
FIG. 6 is a sectional view of FIG. 2 in the direction of the arrows IV–IV'.

Moreover, the embodiment illustrated in FIG. 5 shows a peripheral ribbon located on either side of the fixed plate (1) and consisting of a single band (10, 11) on each side. If it is desired to produce several deformable membranes on top of a single common fixed plate (1), the metal ribbon may then be segmented into as many portions as necessary.

Figure 7:
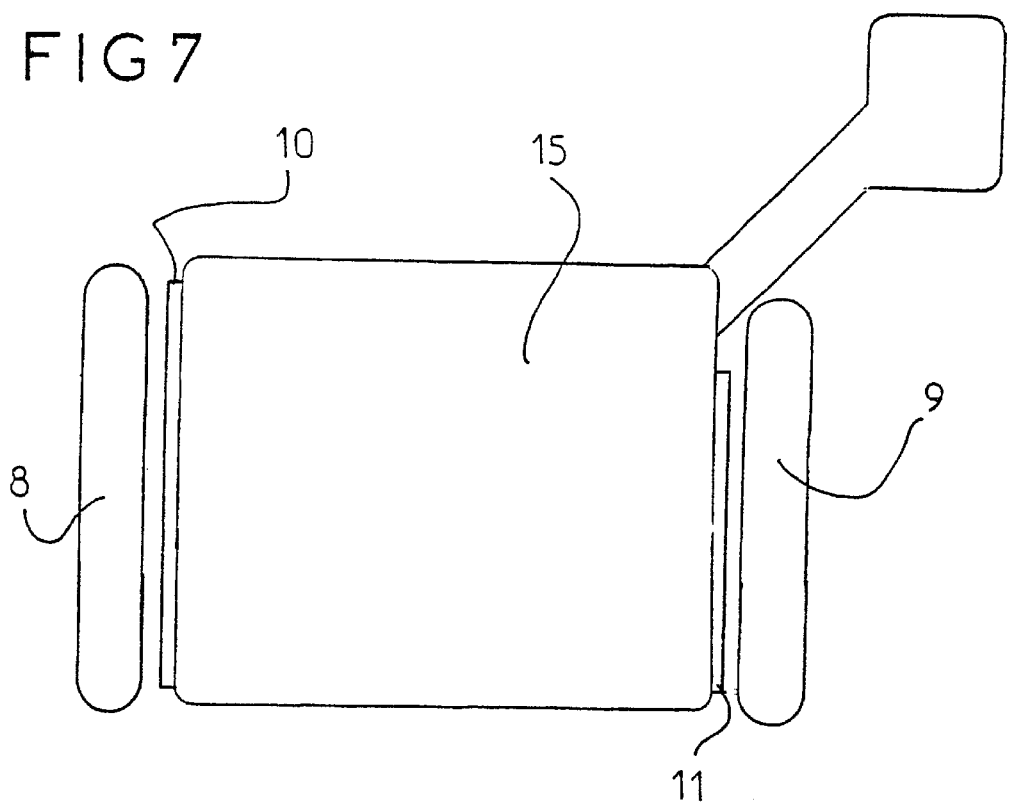
FIG. 7 is a top view of a microcomponent during production according to the invention, after the sacrificial resin layer has been deposited.
Figure 8:
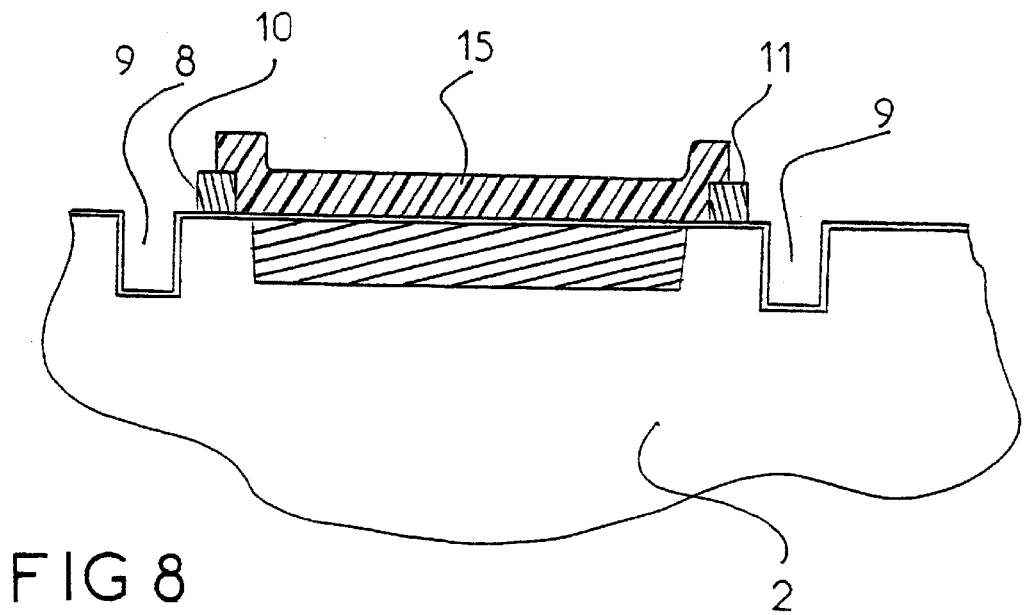
FIG. 8 is a sectional view of FIG. 7 in the direction of the arrows VIII–VIII'.

Next, as illustrated in FIGS. 7 and 8, a sacrificial resin (15) is deposited with a thickness, close to 2 micrometers, corresponding approximately to the gap which will exist between the fixed plate (1) and the deformable membrane. Typically, this resin has a thickness approximately equal to that of the peripheral ribbon (10, 11). Of course, this thickness value is given by way of example, and it may be tailored according to the geometry associated with the applications. The material used for this resin is among the materials conventionally used in microelectronics.

Next, an electrolytic growth sublayer is deposited on top of the sacrificial resin layer (15), the exposed part of the ribbon (10, 11) and the anchoring grooves (8, 9). This layer is typically made of titanium or chromium, chosen for its capability of adhering to silica. The process then continues with a lithographic step in order to cover this growth sublayer and to leave it exposed only at the necessary places on the sacrificial resin layer (15) and at the peripheral ribbon (10, 11) and anchoring groove (8, 9).

Next, an electrolysis step is carried out allowing the deformable membrane (20) to be produced on top of the remaining growth sublayer. The choice of metal used depends on the stresses required for the stiffness of the membrane.

The process then continues with the removal of the sacrificial resin layer and of the growth sublayer covered beforehand by the lithographic etching.

Figure 9:
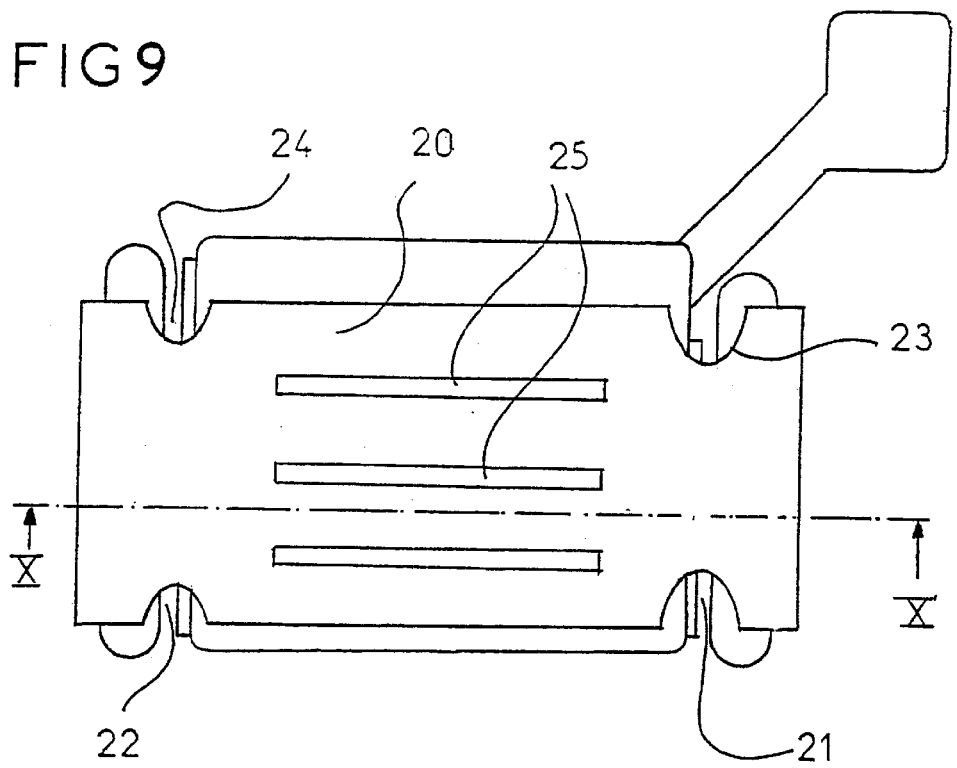
FIG. 9 is a top view of the microcomponent according to the invention, illustrated after the deformable plate has been deposited.
Figure 10:
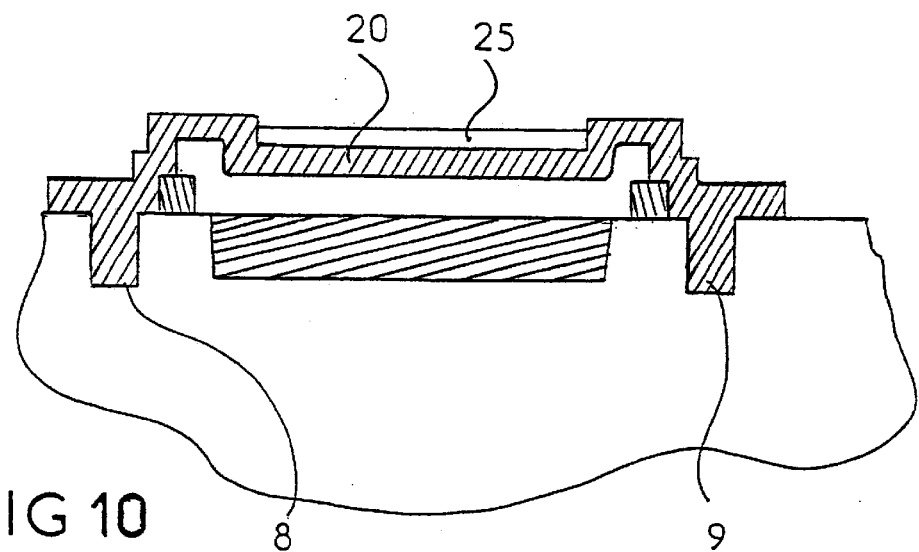
FIG. 10 is a sectional view of FIG. 9 in the direction of the arrows X–X'.

As illustrated in FIG. 9, the movable membrane (20) has, vertically in line with the border of the fixed plate, indentations (21–24) defining an aperture for passage of the substances used for dissolving the resin. These indentations are especially useful if several deformable membranes are placed side by side. In the case of a microcomponent having only one movable membrane of large dimensions, it is then pierced by holes or indentations over a major part of its surface in order to allow flow of the substances needed to dissolve the sacrificial resin.

Next, according to another characteristic of the invention, a second resin is deposited on top of the deformable membrane. This second resin may be exposed in certain characteristic regions in order to reveal certain regions of the deformable plate (20) itself. In these regions, it is then possible by an additional electrolysis operation to form beams (25) whose stiffness is added to and combined with those of the deformable membrane. Thus, the moment of inertia of the surface is modified, thereby modifying the membrane deformation law.

Advantageously, these additional beams (25) have a thickness possibly up to 30 microns and may be made, for example, of nickel. Next, the additional resin deposited on top of the deformable membrane (20) is removed.

Of course, the various thicknesses and the dimensions and choice of materials used depend on the technological constraints of the desired applications and are not limited to the valid ones described above. Thus, it is possible to obtain capacitors whose capacitance can vary between a few tens of femtofarads and a few tens of picofarads. Depending on the application, the gap may be up to a few micrometers. Of course, these values are given by way of example and they may vary depending on the types of components produced and on their applications.

It is apparent from the foregoing that the process according to the invention has many advantages and especially:

the possibility of producing a capacitor of variable capacitance, whose gap, or the distance between its fixed plate and its variable plate, is particularly uniform, making the component very precise;

the possibility of using microcomponents such as a microswitch for applications operating in the radio frequency range (from 100 megahertz to 5 gigahertz), the use of low-resistivity metals, such as copper or gold, proving to be advantageous with regard to insertion losses of the metal/metal contact, for applications in the high-frequency range (from 5 gigahertz to 100 gigahertz), the use of a dielectric interlayer making it possible to obtain a capacitive contact, without any risk of causing bonding between the movable membrane and the fixed membrane;

the possibility of producing a plurality of variable capacitors sharing the same fixed plate;

the use of relatively low temperatures, allowing the process to be carried out directly on integrated circuits without any risk of modifying the functionalities of said circuits; and the possibility of modifying the mechanical structure of the deformable membrane in order to adapt its deformation law to the desired application.

What is claimed is:

1. A process for fabricating electronic microcomponents, of the variable capacitor or microswitch type, comprising a fixed plate (1) and a deformable membrane (20) which are located opposite each other, which comprises the following steps, consisting in:

depositing a first metal layer on an oxide layer (2), said first metal layer being intended to form the fixed plate;

depositing a metal ribbon (10, 11) on at least part of the periphery and on each side of the fixed plate (1), said ribbon being intended to serve as a spacer between the fixed plate (1) and the deformable membrane (20);

depositing a sacrificial resin layer (15) over at least the area of said fixed plate (1);

generating, by lithography, a plurality of wells in the surface of said sacrificial resin layer;

depositing, by electrolysis, inside the wells formed in the sacrificial resin (15), at least one metal region intended to form the deformable membrane (20), this metal region extending between sections of the metal ribbon (10, 11) which are located on each side of said fixed plate (1);

removing the sacrificial resin layer (15).

2. The process as claimed in claim 1, wherein the oxide layer (2) is deposited on an integrated circuit.

3. The process as claimed in claim 1, wherein the oxide layer (2) is made of quartz.

4. The process as claimed in claim 1, wherein the first metal layer intended to form the fixed plate is inserted into a recess (3) formed in the oxide layer (2).

5. The process as claimed in claim 1, wherein the first metal layer includes an extension (5) associated with a connection pad (6).

6. The process as claimed in claim 1, wherein the ribbon (10, 11) is present along the periphery of the fixed plate (1), on two opposed sides of the latter.

7. The process as claimed in claim 1, wherein the ribbon consists of a succession of individual segments.

8. The process as claimed in claim 1, wherein the sacrificial resin layer (15) partly covers the peripheral ribbon (10, 11).

9. The process as claimed in claim 1, which also includes a step consisting in etching the oxide layer in order to form one or more anchoring grooves (8, 9) intended to accommodate part of the peripheral ribbon (10, 11).

10. The process according to claim 1, which also includes a step consisting in etching the oxide layer in order to form one or more anchoring grooves (8, 9) intended to accommodate part of the ends of the deformable membrane (20).

11. The process as claimed in claim 9, wherein the anchoring groove (8, 9) has a width (w) about twice the thickness of the deformable membrane (20).

12. The process as claimed in claim 11, wherein the anchoring groove (8, 9) has a depth (d) more than one and a half times its width (w).

13. The process as claimed in claim 1, which furthermore includes a step consisting, after the fixed plate has been deposited, in depositing a film (6) of a dielectric, intended to prevent the deformable membrane from bonding to said fixed plate.

14. The process as claimed in claim 1, which furthermore includes a step consisting, after the sacrificial resin (15) has been removed, in producing, on the upper face of the deformable membrane or membranes, raised regions (25) capable of modifying the moment of inertia of the surface of the deformable membrane so as to produce membranes with programmed deformation.

15. The process as claimed in claim 14, wherein the raised features are longitudinal ribs (25).

16. The process as claimed in claim 1, wherein the metal used both for producing the fixed plate and the deformable membrane is chosen from the group comprising copper, chromium, nickel and alloys including these metals.

* * * * *